(12) United States Patent
Bulovic et al.

(10) Patent No.: US 8,739,390 B2
(45) Date of Patent: Jun. 3, 2014

(54) METHOD FOR MICROCONTACT PRINTING OF MEMS

(75) Inventors: Vladimir Bulovic, Lexington, MA (US); Corinne Evelyn Packard, Somerville, MA (US); Jennifer Jong-Hua Yu, Palo Alto, CA (US); Apoorva Murarka, Cambridge, MA (US); LeeAnn Kim, Somerville, MA (US)

(73) Assignee: Massachusetts Institute of Technology, Carridge, MA (US)

( * ) Notice: Subject to any disclaimer, the term of this patent is extended or adjusted under 35 U.S.C. 154(b) by 175 days.

(21) Appl. No.: 12/636,757

(22) Filed: Dec. 13, 2009

(65) Prior Publication Data

US 2010/0188796 A1 Jul. 29, 2010

Related U.S. Application Data

(60) Provisional application No. 61/138,014, filed on Dec. 16, 2008.

(51) Int. Cl.
H01H 11/00 (2006.01)

(52) U.S. Cl.
USPC ............................ 29/622; 29/602.1; 29/592.1

(58) Field of Classification Search
USPC .................. 29/592.1, 593–594, 25.35–25.42, 29/846–847; 438/22–23; 333/196–199; 257/40, 79, 88
See application file for complete search history.

(56) References Cited

U.S. PATENT DOCUMENTS

| | | | |
|---|---|---|---|
| 4,266,263 A | 5/1981 | Haberl et al. | |
| 5,862,239 A | 1/1999 | Kubli et al. | |
| 6,160,828 A | 12/2000 | Kozlov et al. | |
| 6,243,474 B1 | 6/2001 | Tai et al. | |
| 6,294,398 B1 | 9/2001 | Kim et al. | |
| 6,444,400 B1 | 9/2002 | Cloots et al. | |
| 6,472,962 B1 * | 10/2002 | Guo et al. | 333/262 |
| 6,498,802 B1 | 12/2002 | Chu et al. | |
| 6,586,763 B2 | 7/2003 | Marks et al. | |
| 7,346,981 B2 * | 3/2008 | Borwick et al. | 29/846 |

(Continued)

FOREIGN PATENT DOCUMENTS

| | | |
|---|---|---|
| DE | 10 2007 -1699 | 10/2008 |
| WO | WO 03-073164 | 9/2003 |

(Continued)

OTHER PUBLICATIONS

Hanseup Kim et al., "Characterization of Aligned Wafer-Level Transfer of Thing and Flexible Parlene Membranes", *Journal of Microelectromechanical Systems*, Dec. 1, 2007, vol. 16, No. 6, pp. 1386-1396.

(Continued)

*Primary Examiner* — Minh Trinh
(74) *Attorney, Agent, or Firm* — Salehi Law Group

(57) ABSTRACT

The embodiments disclosed herein are directed to fabrication methods useful for creating MEMS via microcontact printing by using small organic molecule release layers. The disclose method enables transfer of a continuous metal film onto a discontinuous platform to form a variable capacitor array. The variable capacitor array can produce mechanical motion under the application of a voltage. The methods disclosed herein eliminate masking and other traditional MEMS fabrication methodology. The methods disclosed herein can be used to form a substantially transparent MEMS having a PDMS layer interposed between an electrode and a graphene diaphragm.

15 Claims, 20 Drawing Sheets

(56) References Cited

U.S. PATENT DOCUMENTS

| | | | |
|---|---|---|---|
| 7,406,761 B2 * | 8/2008 | Jafri et al. | 29/831 |
| 7,439,093 B2 | 10/2008 | Beaudry | |
| 7,816,710 B2 | 10/2010 | Palmateer et al. | |
| 7,836,574 B2 * | 11/2010 | Jafri et al. | 29/594 |
| 8,601,658 B2 * | 12/2013 | Bulovic et al. | 29/25.42 |
| 2002/0045105 A1 | 4/2002 | Brown et al. | |
| 2004/0004988 A1 | 1/2004 | Cok et al. | |
| 2004/0056244 A1 | 3/2004 | Marcus et al. | |
| 2005/0230348 A1 | 10/2005 | Kido | |
| 2006/0048885 A1 | 3/2006 | Constantin | |

FOREIGN PATENT DOCUMENTS

| | | |
|---|---|---|
| WO | WO 2004-107403 | 12/2004 |
| WO | WO 2008/133942 | 11/2008 |
| WO | WO 2009/096419 | 8/2009 |

OTHER PUBLICATIONS

Meitl et al., "Transfer Printing by Kinetic Control of Adhesion to an Elastometric Stamp," *Nature Materials Nature Publishing Group UK*, vol. 5, No. 1, Jan. 2006, pp. 33-38.

International Preliminary Report on Patentability issued on Oct. 6, 2009 for PCT Application No. PCT/US09/030151.

International Preliminary Report on Patentability issued on Feb. 8, 2011 for PCT Application No. PCT/US09/053086.

International Search Report and Written Opinion dated Mar. 29, 2010 issued for PCT Application No. PCT/US2009/056267.

International Search Report and Written Opinion dated Dec. 10, 2010 issued for PCT Application No. PCT/US2009/067801.

International Search Report dated Jun. 16, 2011 for PCT Application No. PCT/US2010/052403. [MIT-0816].

\* cited by examiner

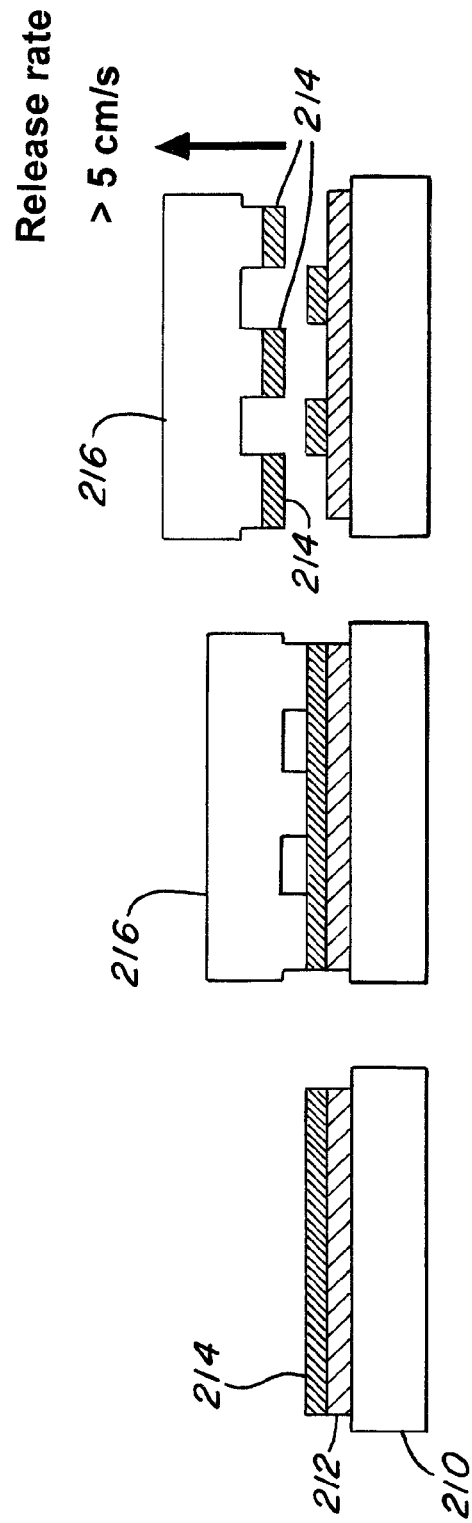

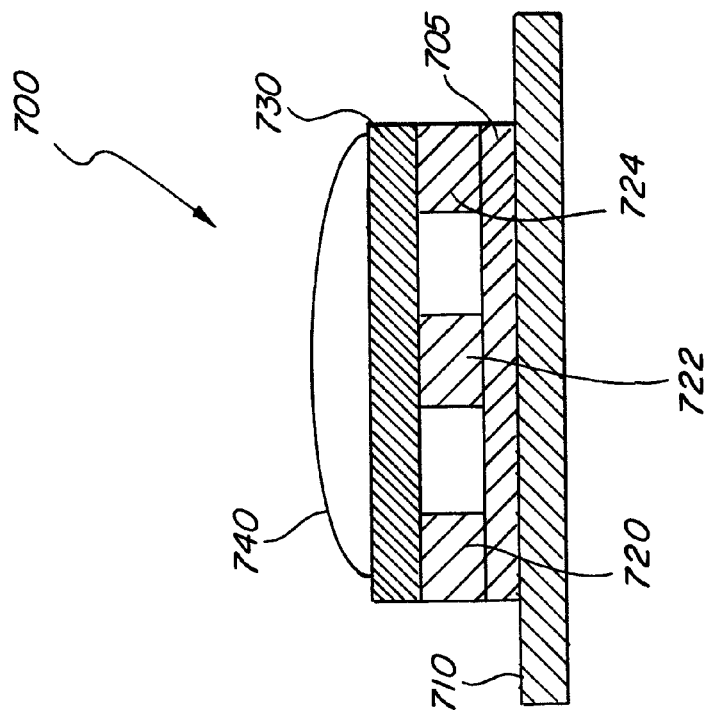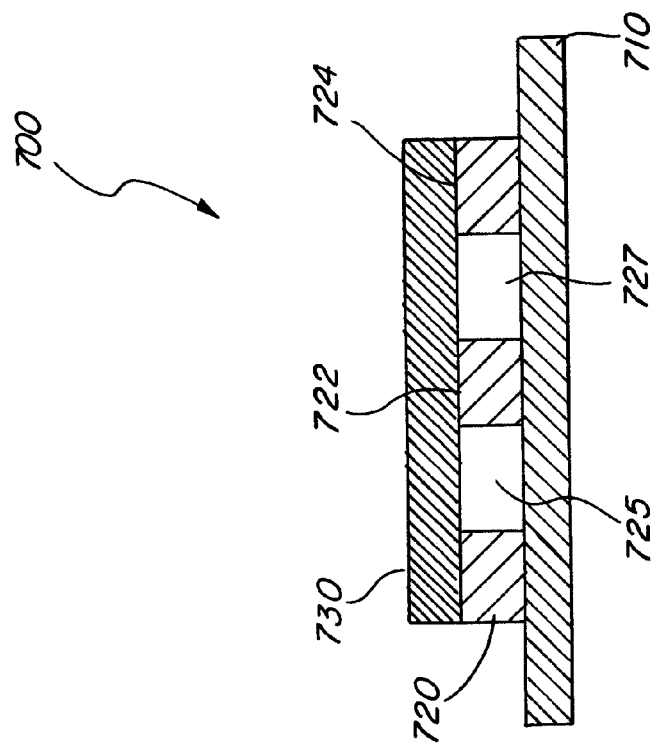
FIG. 7A
FIG. 7B

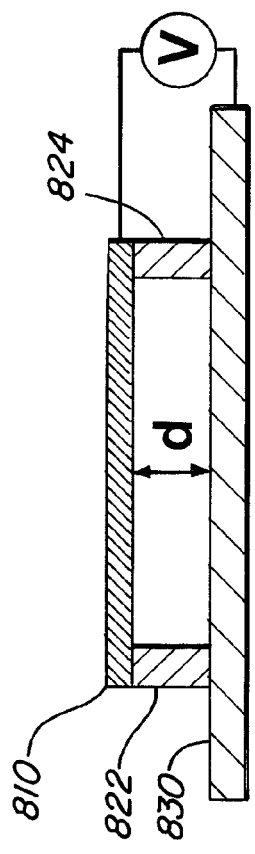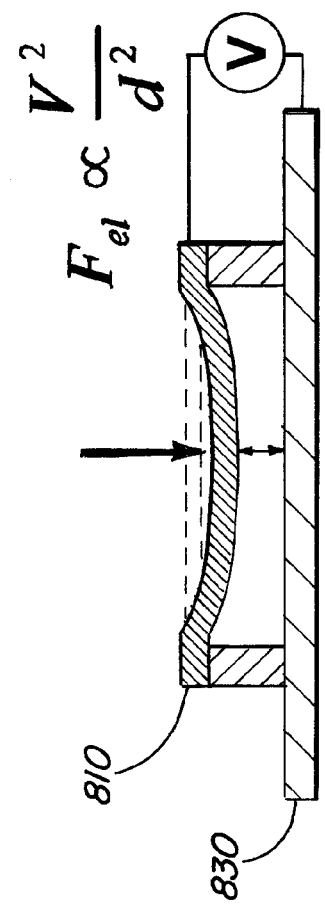
FIG. 8A
FIG. 8B

METHOD FOR MICROCONTACT PRINTING OF MEMS

The application claims the filing-date priority of Provisional Application No. 61/138,014, filed Dec. 16, 2008, the disclosure of which is incorporated herein in its entirety.

This invention was made with government support under grant number HR0011-06-1-0045 awarded by the Defense Advanced Research Projects Agency. The government has certain rights in this invention.

BACKGROUND

1. Field of the Invention

The disclosure relates to a method and apparatus for microcontact printing of microelectro-mechanical systems ("MEMS"). More specifically, the disclosure relates to a novel method and apparatus for direct patterning of metallic MEMS through microcontact printing.

2. Description of Related Art

MEMS applied over large areas would enable applications in such diverse areas as sensor skins for humans and vehicles, phased array detectors and adaptive-texture surfaces. MEMS can be incorporated into large area electronics. Conventional photolithography-based methods for fabricating MEMS have provided methods and tools for producing small features with extreme precision in processes that can be integrated with measurement and control circuits. However, the conventional methods are limited to working within the existing silicon semiconductor-based framework. Several challenges, including expense, limited size and form-factor, and a restricted materials set, prevent the future realization of new MEMS for applications beyond single chip or single sensor circuits. Standard processing techniques are particularly restrictive when considering expanding into large area fabrication. Conventional photolithography methods are also incompatible with printing flexible substrates MEMS and micro-sized sensor arrays.

For example, in creating free-standing bridges, cantilevers or membranes from limited material, the conventional methods require surface or bulk micromachining, a series of photolithographic masking steps, thin film depositions, and wet chemical or dry etch releases. Such steps require investing in and creating highly specialized mask sets which render conventional photolithography expensive and time and labor intensive. While the initial investment can be recovered by producing large batches of identical MEMS devices, the conventional methods are cost prohibitive for small batches or for rapid prototype production.

Conventional MEMS have been based on silicon and silicon nitride which are deposited and patterned using known facile processes. Incorporating mechanical elements made of metal on this scale is difficult because of the residual stresses and patterning challenges of adding metal to the surface. This is because metals are resistant to aggressive plasma etching. As a result, conventional MEMS processing apply liftoff or wet chemical etching. The surface tension associated with drying solvent during these patterning steps or a later immersion can lead to stiction (or sticking) of the released structure. Stiction dramatically reduces the production yield.

Another consideration in some large area applications is flexibility. Although photolithography is suitable for defining high fidelity patterns on planar and rigid substrates, it is difficult to achieve uniform registration and exposure over large areas. Display technologies have been among the first applications to create a market for large area microelectronics. To meet the challenges of new markets for large area electronics, alternative means to patterning have been proposed which include: shadow masking, inkjet printing, and micro-contact printing. These techniques are often the only options available for organic semiconductors and other nanostructured optoelectronic materials, some of which have particularly narrow threshold for temperature, pressure and solvent. Conventional methods are not suitable for MEMS using organic semiconductors, nanostructured optoelectronic materials which may be fabricated on a flexible substrate.

An alternative approach is to fabricate electronic structures directly on flexible sheets, but polymeric substrates offering this flexibility are typically limited to low-temperature processing. Accordingly, high temperature processing such as thermal growth of oxides and the deposition of polysilicon on a flexible substrate cannot be supported by conventional processes. Another approach is to fabricate structures on silicon wafers, bond them to a flexible sheet, and then release the structures from the silicon by fracturing small supports or by etching a sacrificial layer. However, this approach tends to locate the structures on the surface having the highest strain during bending.

Therefore, there is a need for flexible, large area fabrication of MEMS that does not rely on photolithography nor requires harsh processing conditions.

SUMMARY

In one embodiment, the disclosure relates to a microcontact printing process by which continuous metal films are transferred over a relief structure to form a suspended membrane in a single step. One or more release layers are used to assist the transfer process. The disclosed embodiments are advantageous in enabling MEMS fabrication without requiring elevated temperature processing, high pressure, wet chemical or aggressive plasma release etching used in conventional processes. Compatibility with low temperature semiconductors on flexible polymeric substrates, as described herein, enables rapid, near-room-temperature fabrication of flexible, large area, integrated micro- or optoelectronic/MEMS circuits.

In another embodiment, the disclosure relates to a contact-stamping for subtractive patterning of organic light emitting diode electrodes using a relief poly(dimethylsiloxane) ("PDMS") in a process called Quick Release PDMS Lift-Off Patterning (QR-PLOP). In contrast to conventional methods, QR-PLOP requires no pressure application, temperature elevation or stamp surface modification. Patterning of the OLED electrodes can be enabled by the kinetically-controlled adhesion of the PDMS relief stamp to the surface to be patterned. Patterning is implemented by placing a relief-patterned viscoelastic PDMS stamp in contact with a planar metal electrode layer and subsequently peeling off the stamp quickly, increasing the weak adhesion energy of the elastomer to the metal and defining features by subtractive means. Patterning is a function of film thickness, feature geometry, and peel direction of stamp release.

In one embodiment, the disclosure relates to a method for micro-contact printing of MEMS by providing a MEMS structure and a support structure. The MEMS structure is defined by a plurality of ridges separated by a gap therebetween. The ridges can be constructed from PDMS. The MEMS support structure includes a substrate on which a release layer and a metal layer are formed. The MEMS structure is brought to contact with the support structure such that the top of the ridges adhere to the metal layer. The MEMS structure is then rapidly peeled away from the support structure so as to delaminate substantially all of the metal layer from the support structure. In one embodiment, at least a portion of the release layer is also separated from the support structure. The peeling velocity is in the range of about 3-6 m/sec. Once peeled, the layer forms a suspended membrane over the plurality of ridges such that a diaphragm is formed over the gaps separating the plurality of ridges.

In another embodiment, the disclosure relates to a method for forming a MEMS capacitor array by forming a first electrode layer over a substrate. A PDMS structure is then formed over the first electrode layer. The PDMS structure defines a plurality of ridges in which at least a pair of adjacent ridges are separated by a gap. A metal film deposited on a surface of a support structure in contact with the top portion of the plurality of ridges. The metal layer is then allowed to adhere to the tops of the ridges. Once adhered, the support structure is then rapidly peeled off from the PDMS structure. The rapid peel off process allows substantially all of the metal layer to delaminate from the support structure and adhere to tops of the PDMS ridges. The metal layer forms a suspended membrane over the gap between the pair of adjacent ridges. The final structure is a capacitor with PDMS support ridges, a first electrode layer and a metal layer on top of the PDMS ridges acting as a suspended second electrode, whose spacing from the first can be controlled with a DC bias voltage.

In still another embodiment, the disclosure relates to a high resolution patterning of the metal film. Higher resolution patterning of the transferable metal film can be achieved by using the topography of a molded PDMS substrate to define features instead of using a shadow mask. The process includes the steps of (1) Curing PDMS or other elastomer against a featured mold so that the desired pattern is raised on the final PDMS substrate; (2) Depositing the organic release layer and metal film using a line-of-sight deposition process such as thermal evaporation so that the film multilayer on top of the PDMS features is discontinuous from the multilayer formed at background height of the PDMS (in this way, the features of the PDMS act as an in situ mask); and (3) Bringing the metal film into contact with the device substrate which contains a plurality of support ridges over a conducting bottom electrode and rapidly removed so that the metal film is transferred to the support ridges to form the final structure. Using this procedure, devices which have clearly defined edges and arbitrarily designed geometries are formed which were otherwise unattainable with the conventional shadow mask film patterning.

BRIEF DESCRIPTION OF THE DRAWINGS

These and other embodiments of the disclosure will be discussed with reference to the following exemplary and non-limiting illustrations, in which like elements are numbered similarly, and where:

FIGS. 2A-2C are schematic representations of a method for constructing electrodes using QR-PLOP according to one embodiment of the disclosure;

FIG. 7A is a schematic characterization of an ideal device geometry;

FIG. 7B is a schematic characterization of an actual device geometry;

FIGS. 8A and 8B schematically illustrate device performance measurement through capacitance;

DETAILED DESCRIPTION

Figure 1A:
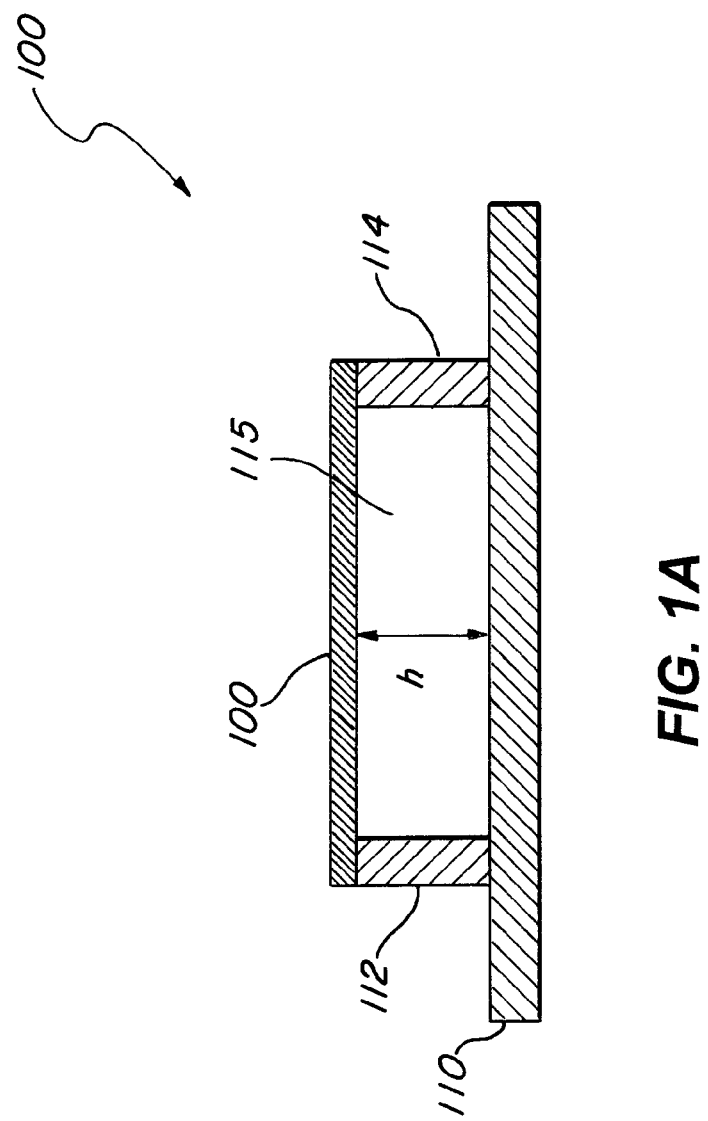
FIG. 1A is a schematic representation of a conventional MEMS device.

FIG. 1A is a schematic representation of a conventional MEMS device. MEMS 100 includes substrate 110 having supports 112 and 114. Supports 112 and 114 can be viewed as a plurality of ridges separated by gap 115. Supports 112 and 114 uphold layer 116. Gap 115 is defined by the separation distance between ridges 112 and by the height (h). Conventionally, layer 116 is defined by a metal layer and MEMS structure 100 is formed through photolithography as described above. As stated, the conventional processes lacked ability to produce MEMS devices over large areas and on flexible substrates.

Figure 1C:
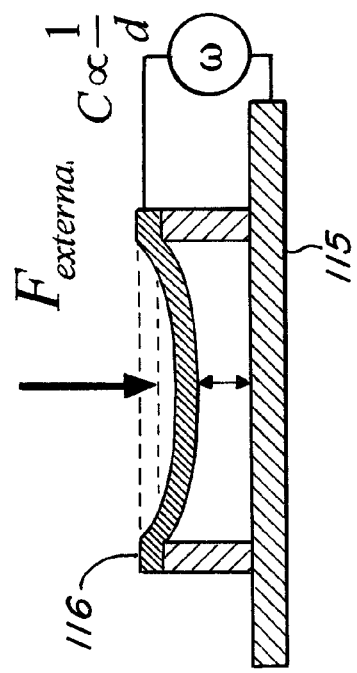
FIG. 1C shows an application of the MEMS device of FIG. 1A as a sensor.
Figure 1B:
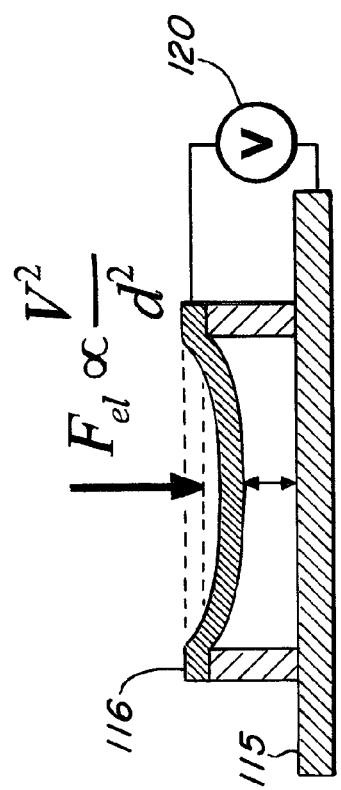
FIG. 1B shows an application of the MEMS device of FIG. 1A as an actuator.

FIG. 1B shows an application of the MEMS device of FIG. 1A used as an actuator. In FIG. 1B, structure 100 is connected to voltage source 120 through substrate 115 and diaphragm 116 which act as electrodes. The bias provided by voltage source 120 creates an electrostatic force between electrode 115 and layer 116, causing the latter to act as a diaphragm by deflecting towards electrode 115. The relationship between the electrostatic force and the deflection is described in Equation 1 as follows:

$$F_{el} \propto V^2/d^2 \quad (1)$$

In Equation I, $F_{el}$ denotes the electrostatic force, V is the bias voltage and d is the separation distance between substrate 115 and metal layer 116. The actuator of FIG. 1B converts the deflection in the diaphragm (force exerted thereon) to electrostatic force or vice versa.

FIG. 1C shows an application of the MEMS device of FIG. 1A for use as a sensor. In FIG. 1C, external force $F_{ext}$ is applied to MEMS structure 100 causing deflection in metal layer 116. The external force is measurable as it creates a change in capacitance (C) of the MEMS device. The capacitance can be determined by Equation 2 as follows:

$$C \propto 1/d \quad (2)$$

It should be noted that a metal layers is used as merely an exemplary embodiment. Any material which can be formed in to a film can be used. Such material include viscoelastic polymers and conductive films. In one embodiment, a conductive mm is used. The conductive film can include a metal, a conducting metal oxide, grapheme sheet, polymer thin film, metal oxide/nitride/sulfide membrane or a doped polymer. An exemplary conductive film is indium tin oxide ("ITO"). In another embodiment, an electrically insulating membrane is coated with a conductive layer to form a diaphragm.

FIGS. 2A-2C are schematic representations of a method for constructing electrodes according to one embodiment of the disclosure. The method can be defined as quick release PDMS lift-off patterning ("QR-PLOP"). The exemplary method starts in FIG. 2A by providing substrate 210 having thereon release layer 212 and metal film 214. Substrate 210 can comprise glass, plastic, silicon and other flexible or rigid film or bulk material.

Release material 212 may include conventional release material. A preferred release layer comprises N,N'-diphenyl-N-N'-bis(3-methylphenyl)-(1,1'-biphenyl)-4,4'-diamine ("TPD") having a thickness of about 90 nm. The metal layer preferably comprises a material capable of acting as an electrode. In one embodiment, metal layer 214 defines a gold layer with a thickness of about 140 nm. The metal layer can be deposited, for example, through shadow masking over the release layer.

Next, as illustrated in FIG. 2B, a MEMS structure (i.e., stamp 216) having a support layer and a plurality of ridges is provided. The MEMS structure is prepared as a function of its intended use. A common MEMS structure which is used in applications ranging from pressure sensor to array detectors includes a base layer supporting a plurality of ridges. The ridges can be spaced apart such that each pair of adjacent ridges is separated by a gap. In one embodiment of the invention, the gap is about 1-50 nm. The gap can also be in the range of 5-25 μm. Finally, as illustrated in FIG. 2C, the stamp is lifted rapidly from the substrate, lifting with it a layer of release material. A release rate of about 5 m/sec or more has been found effective in removing substantially all of the metal film from the substrate. A slower peeling rate may be sufficient for use with thinner metal film or with different release material.

Successful patterning also depends on the film thickness. In one embodiment of the disclosure thin metal films having a thickness of less than 20 nm replicated features as small as 13 μm. Thicker metal films having thickness in excess of about 100 nm are generally highly resistant to patterning. Instead, these thick films are seen to produce continuous film transfer across discontinuous stamp surfaces. By engineering the transfer process according to the film thickness, the suspended membranes and bridges which are used in many MEMS devices can be created in an additive process, termed PDMS Lift-Off Transfer (PLOT).

Figure 3A:
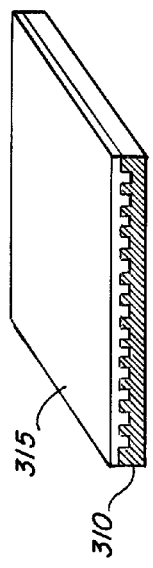
FIGS. 3A-3D pictorially illustrate a method for fabricating a MEMS support structure.

FIGS. 3A-3D pictorially illustrate a method for fabricating a MEMS support structure. In FIG. 3A, a MEMS support material such as PDMS 310 is molded into a master mold 315. The mold can be of any shape. In a preferred embodiment, the mold is designed to produce a MEMS structure with a base layer supporting a plurality of ridges.

Figure 3B:
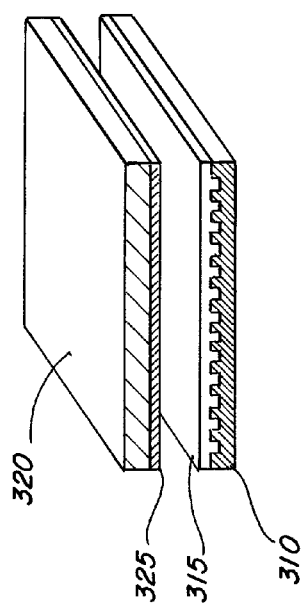

Next, an electrode-coated substrate is brought into contact with PDMS layer 310. As shown in FIG. 3B, the electrode-coated substrate comprises electrode 325 and substrate 320. Substrate 320 can include glass, plastic, or other conventional substrate material. Among others, electrode 325 can comprise conductive material such as gold, silver and Indium Tin Oxide (ITO). In one embodiment of the invention, one or more metal layers are deposited by thermal evaporation.

Figure 3C:
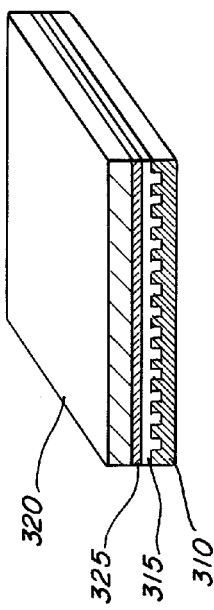
Figure 3D:
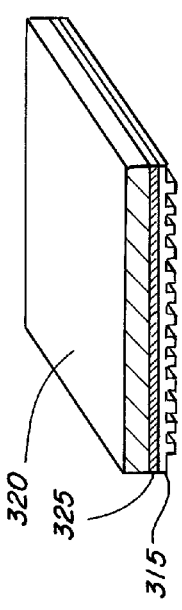

In FIG. 3C, the PDMS is cured to form a solid structure. In a preferred embodiment, PDMS was cured at 50° C. for about one hour. Other conventional curing methods can be equally used without departing from the principles of the disclosure. Finally, in FIG. 3D, mold 310 is removed from the cured MEMS support structure 300. MEMS supports structure 300 includes substrate 320, electrode 325 and PDMS 315. Once the MEMS support structure is prepared, one or more thin layers of electrodes are deposited over the PDMS ridges according to the principles disclosed herein.

Figure 4A:
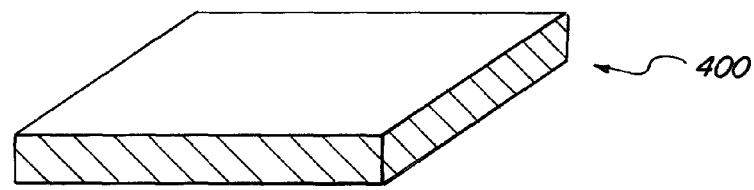
FIGS. 4A-4D pictorially illustrate a method for fabricating a transfer support structure for depositing an electrode layer over the PDMS ridges.

FIGS. 4A-4D pictorially illustrate a method for fabricating a transfer support structure for depositing an electrode layer over the PDMS ridges. In FIG. 4A, substrate 400 is provided to receive the metal film. Substrate 400 can comprise PDMS. While PDMS is used in the exemplary embodiment of FIG. 4A, the inventive principles can be applied equally to other substrate material.

Figure 4B:
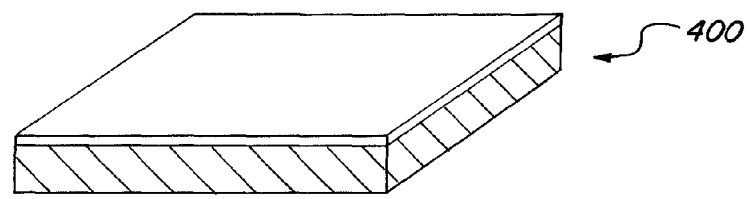
Figure 4C:
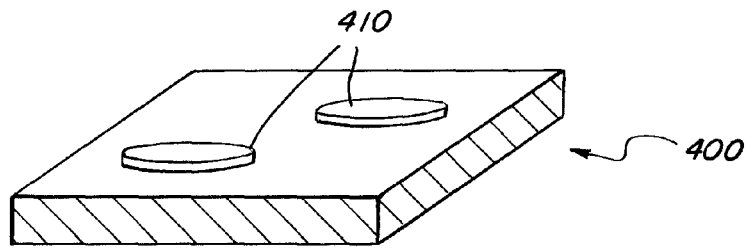

Next, in FIG. 4B, substrate 400 is treated with oxygen plasma. In FIG. 4C, an organic release layer is evaporated through a shadow mask to form a release layer 410 on substrate 400. The release layer can comprise any conventional release material. In one embodiment, the release layer comprises TPD at a thickness of about 90 nm. Release layer 410 can be thermally evaporated onto substrate 400 through a shadow mask.

Figure 4D:
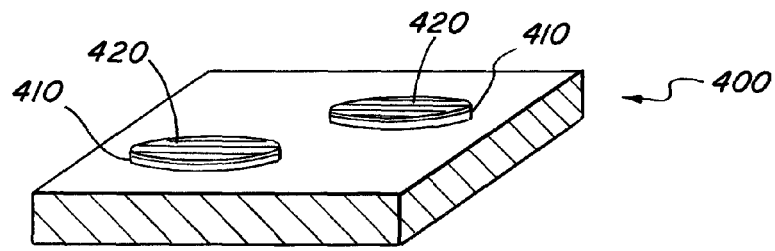

In FIG. 4D, metal layer 420 is deposited over release layer 410. In one embodiment, the metal layer is deposited by evaporating the metal electrode through the same shadow mask used for thermally depositing release layer 410. The metal layer can comprise any material suitable for use as an electrode in the desired MEMS structure. In one embodiment of the disclosure, the metal layer comprises gold and in another embodiment the metal layer comprises silver.

Once the MEMS structure and the support structure have been prepared, the MEMS structure can be brought into conformal contact with the support structure so as to form a adhesive bond between the ridges (or the tops of the ridges) of the MEMS structure and the metal layer on the support structure. Once an adhesive bond is formed, the MEMS structure may be peeled from the support structure so as to delaminate substantially all of the metal layer atop of the support structure. In practice, a portion of the release layer interposed between the metal layer and the substrate adheres to the metal layer and is delaminated from the support structure. The critical peeling velocity may depend on such factors including the size, thickness and the composition of the metal layer. In one embodiment of the invention, a peeling velocity of about 3-6 m/see was found sufficient to delaminate all of the metal layer from the support structure.

Figures 5A, 5B, 5C:
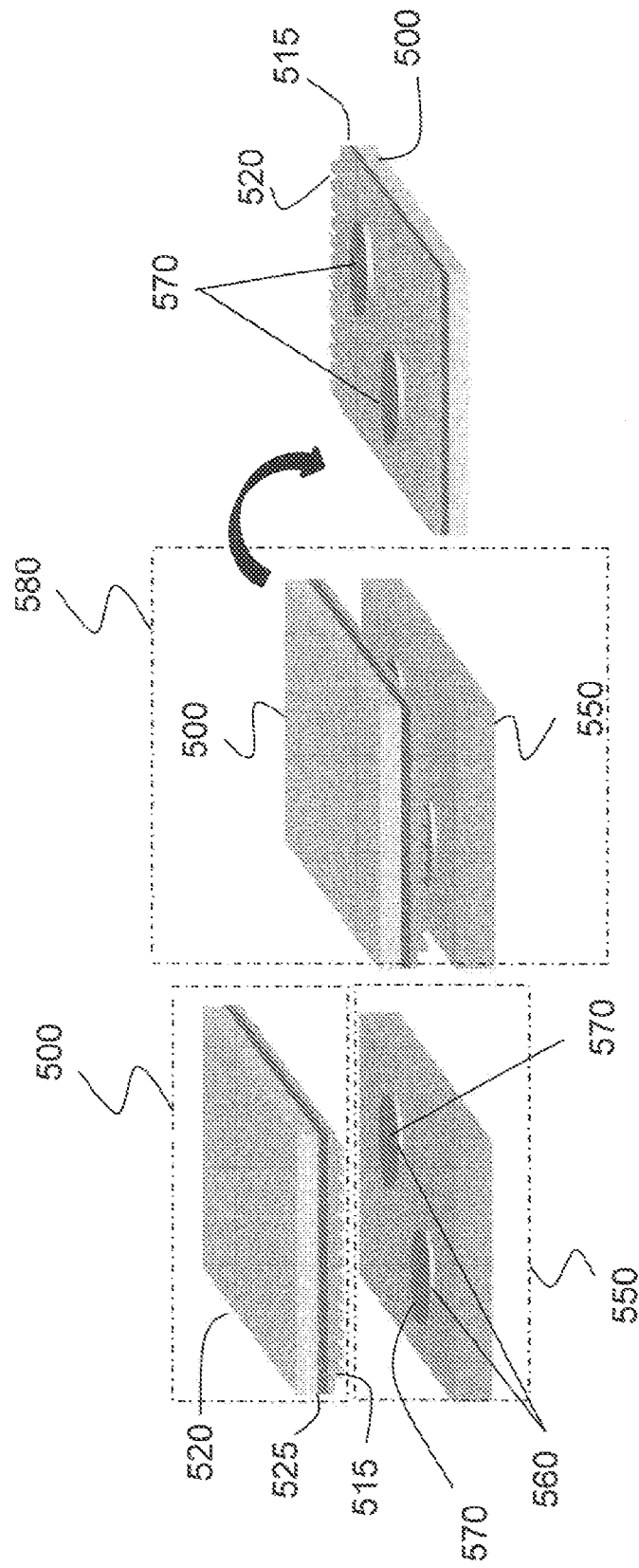
FIG. 5 shows an exemplary processes for PDMS lift-off transfer according to one embodiment of the disclosure.

FIG. 5A shows an exemplary processes for PDMS lift-off transfer according to one embodiment of the disclosure. The MEMS structure prepared in FIG. 3 and the support structure prepared in FIG. 4 were used to illustrate the process of FIG. 5. Specifically, MEMS structure 500 includes electrode 525 and PDMS 515. PDMS 515 is defined by proximal and distal sides. The proximal side of PDMS 515 faces electrode 525. The distal side of PDMS 515 includes a plurality of ridges that are spaced apart. Support structure 550 includes release layer 525 and metal layer 520.

In FIG. 5B, MEMS structure 500 and support structure 550 are brought into conformal contact. Here, each of the ridges formed on the distal end of PDMS 515 contacts metal layer 520. The duration of the contact can be a function of the metal layer and the pressure applied. In the exemplary embodiment where a PDMS MEMS structure was used to adhere to, and lift off, gold metal layer from a support structure, no pressure was applied and the process was conducted at room temperature.

In FIG. 5C, MEMS structure 500 is peeled off from the support structure 550. As discussed, the peeling speed should be controlled to ensure that substantially all of the metal layer is lifted from the surface of the support structure 550. It has been found that typically a portion of the release layer 515 is also removed along with the delaminated metal layer and transfers over to the MEMS structure. Conventional methods can be used to remove any excess release material transferred over to the MEMS structure 500 if desired or required. Once metal layer 520 is transferred to MEMS structure 500, the metal layer adheres to the ridges at the distal end of PDMS 515.

In one embodiment, transfer is achieved by placing a relief patterned with viscoelastic PDMS ridges in contact with the planar metal layer, and peeling off the stamp quickly, increasing the weak adhesion energy of the elastomer to the metal.

The contact delamination of FIGS. 5A-5C can be implemented on metal layer films of different thickness. In one embodiment of the disclosure, the delaminated metal film has a thickness of about 20 nm or more. In an exemplary embodiment, a metal layer having a thickness of about 140 nm was delaminated. Once transferred, the metal layer forms a suspended membrane (or diaphragm) over the plurality of PDMS ridges, thereby completing the MEMS structure.

It should be noted that a rapid peel rate enhances adhesive forced between metal layer 520 and elastomeric features of the layer to provide transfer when the MEMS structure is lifted away. A rapid peel rate of about 5 m/sec enhances the adhesion between a viscoelastic polymer (in this case, PDMS) and silicon component sufficiently to allow these components to be lifted from the substrate. Below a critical threshold peel rate, the increase in adhesive force will not be sufficient to delaminate the metal film from the release layer. The peel rate depends on, for example, metal thickness, support geometry, release layer and the composition of the metal film.

Figure 6A:
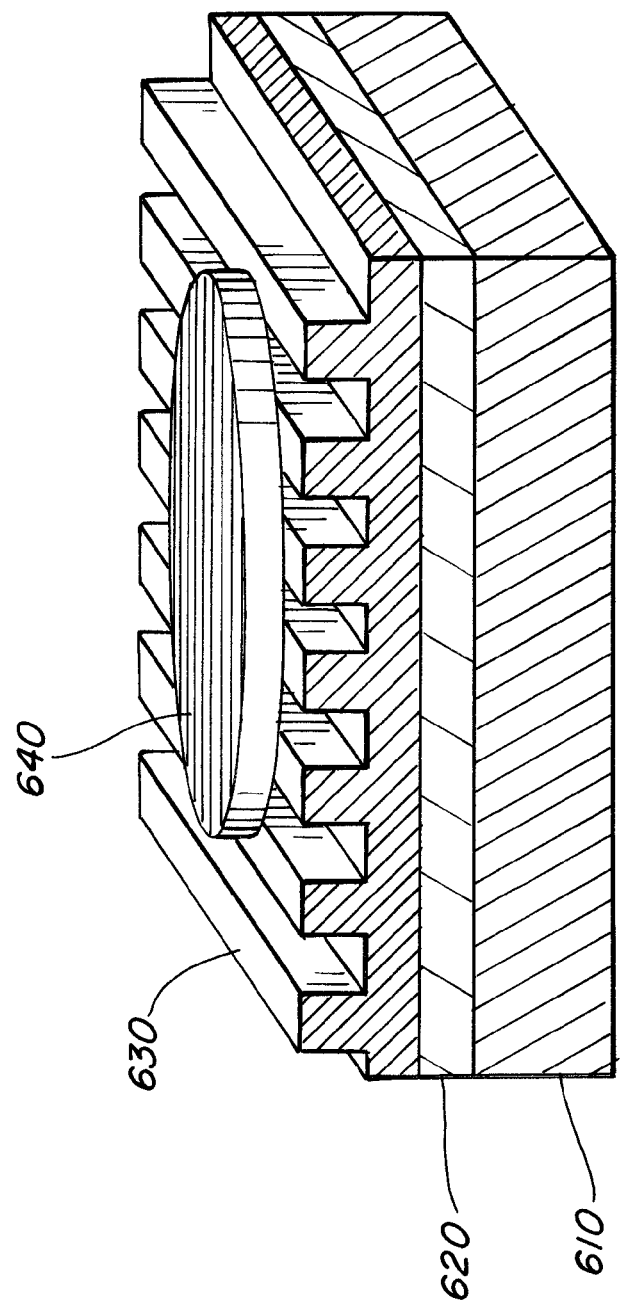
FIG. 6A schematically illustrates a MEMS structure prepared according to the process of FIG. 5.

FIG. 6A shows a MEMS structure prepared according to the process of FIG. 5. Specifically, the MEMS structure includes substrate 610 which supports electrode 620. PDMS grating 630 is formed over the substrate as discussed in relation to FIG. 3 and the transferred gold membrane 640 is transferred onto grating 630 with a QRPLOT process described above. As seen in FIG. 6A, the transferred gold membrane completes the MEMS structure providing a suspended diaphragm over grating 630. The transferred gold layer was 140 nm thick.

Figure 6B:
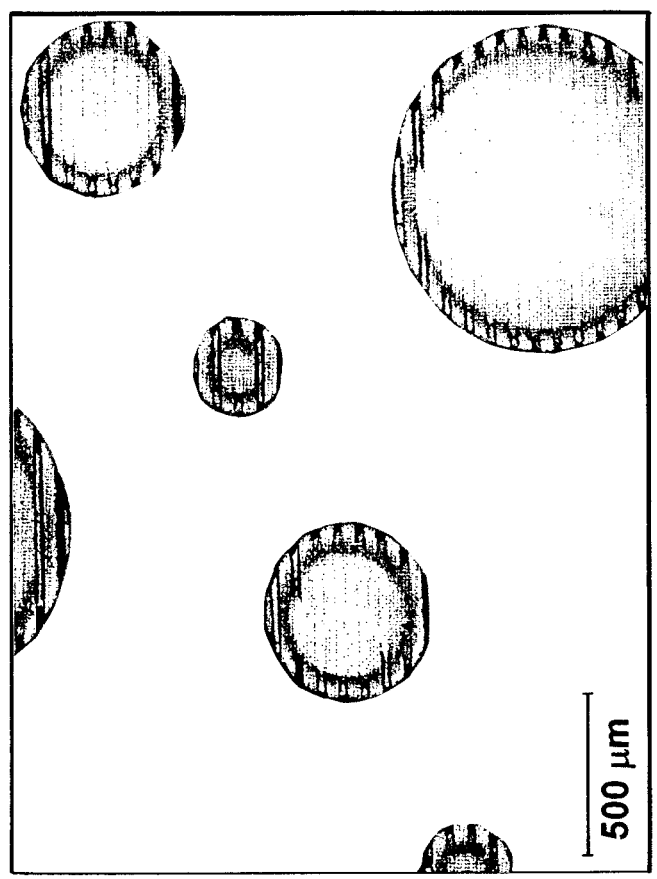
FIG. 6B is an optical micrograph of the MEMS devices whose structure is shown in of FIG. 6A.

FIG. 6B is an exploded view of the MEMS structure of FIG. 6A. Specifically, FIG. 6B shows gold electrodes transferred over to the MEMS structure using an optical microscope. As seen in FIG. 6A, the transferred gold membrane is spread over the ridges of the MEMS support structure, making contact with a plurality of the ridges. The largest gold membrane which appears on the lower right hand side of FIG. 6B had a 1 mm diameter.

Figure 6C:
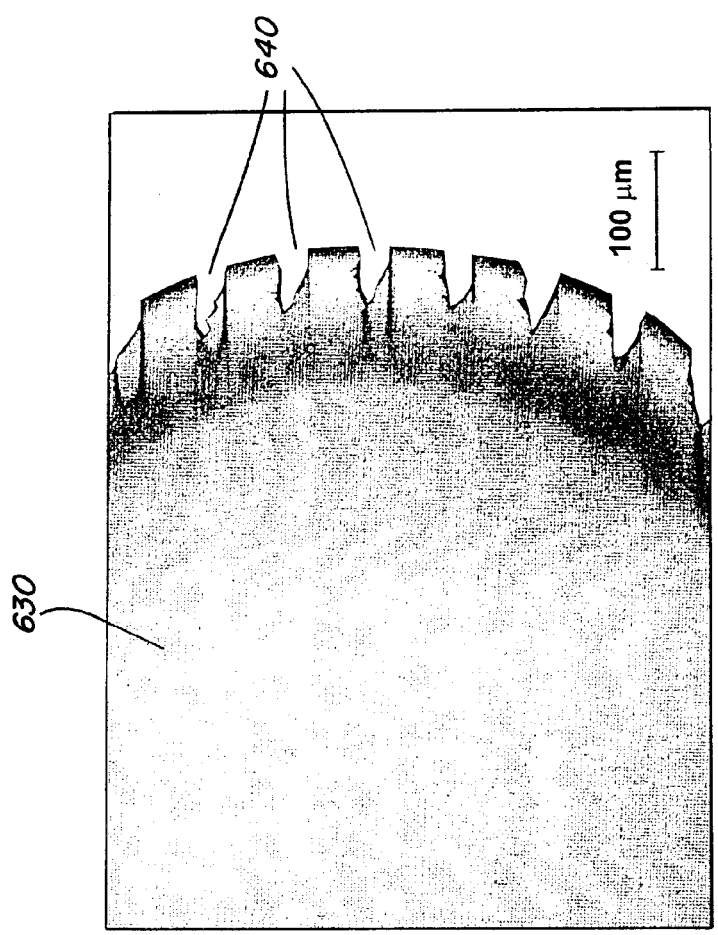
FIG. 6C is an exploded view of FIG. 6B.

FIG. 6C is an exploded view of the MEMS structure of FIG. 6B. Specifically, FIG. 6C shows edges 630 of the MEMS diaphragm as thinner than its central regions resulting in limited transfer over the gaps. The formation of thin edges 630 are the results of shadow masking. The horizontal lines 640 are the PDMS support ridges underneath the gold MEMS diaphragm. The dark circles tracking the edges is caused by shadow masking.

FIG. 7A is a schematic characterization of an ideal device geometry. As shown in FIG. 7A, ITO layer 710 supports PDMS ridges 720, 722 and 724. Gold layer 730 rests on, and is supported by PDMS ridges 720, 722 and 724. Air gaps 725 and 727 were designed to have a width of about 23+/−1 μm, and the air gap height was designed to be about 1.56+/−0.02 μm.

FIG. 7B is a schematic characterization of an actual device geometry which follows the design of FIG. 7A. In practice, release layer 740 adhered to gold layer 730 during the transfer process. In addition, underlayer 705 was a byproduct of creating support ridges 720, 722 and 724. Underlayer 705 had a thickness of about 1-12 μm. Underlayer 705 changes the device capacitance depending on its thickness. In FIG. 7B, the PDMS support width was about 45+/−1 μm and the thickness of gold layer 730 was about 140 nm. The total surface area of device 700 was about 0.8 mm². Two different techniques were used to measure performance of the device shown in FIG. 7B. The techniques were capacitance measurement and deflection of the MEMS diaphragm.

FIGS. 8A and 8B schematically illustrate device performance measurement through capacitance testing. The testing is premised on the fact that higher voltages increase electrostatic force, thereby deflecting the MEMS diaphragm and decreasing the gap. The device under study in FIG. 8, had gold diaphragm deposited according to the disclosed principles. The diaphragm height was about 1.2 μm. In FIGS. 8A and 8B, MEMS gold diaphragm 810 was supported by PDMS ridges 822 and 824. ITO layer 830 acted as the second electrode. Noting the interrelation of electrostatic force with diaphragm deflection through Equations 1 and 2 above, the supplied voltage was changed and the deflection in diaphragm 810 was measured.

Figure 8C:
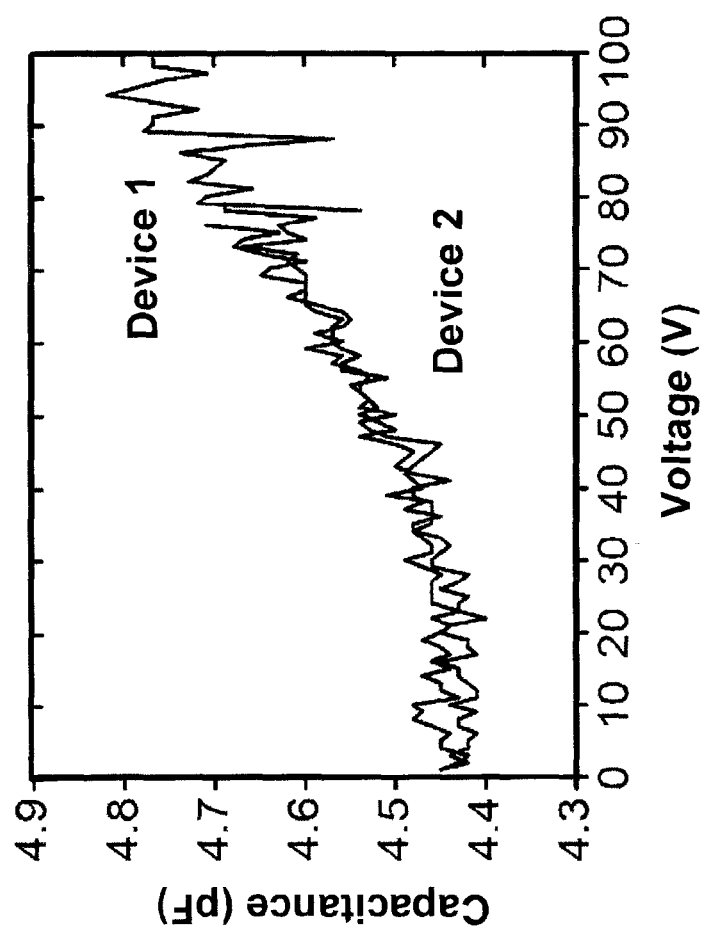
FIG. 8C is capacitance of the devices showing the results of variable capacitor; actuation testing.

FIG. 8C is capacitance of the devices showing variable capacitor actuation. Each device had gold diaphragm of about 1 mm in diameter. The diaphragm rested on PDMS ridges which were about 1.8 μm high and 45 μm wide. The top (gold) and the bottom (ITO) electrodes were about 3 μm apart. As evident from FIG. 8C, capacitance increase in both devices 1 and 2 demonstrates bridge deflection.

Figures 9A, 9B:
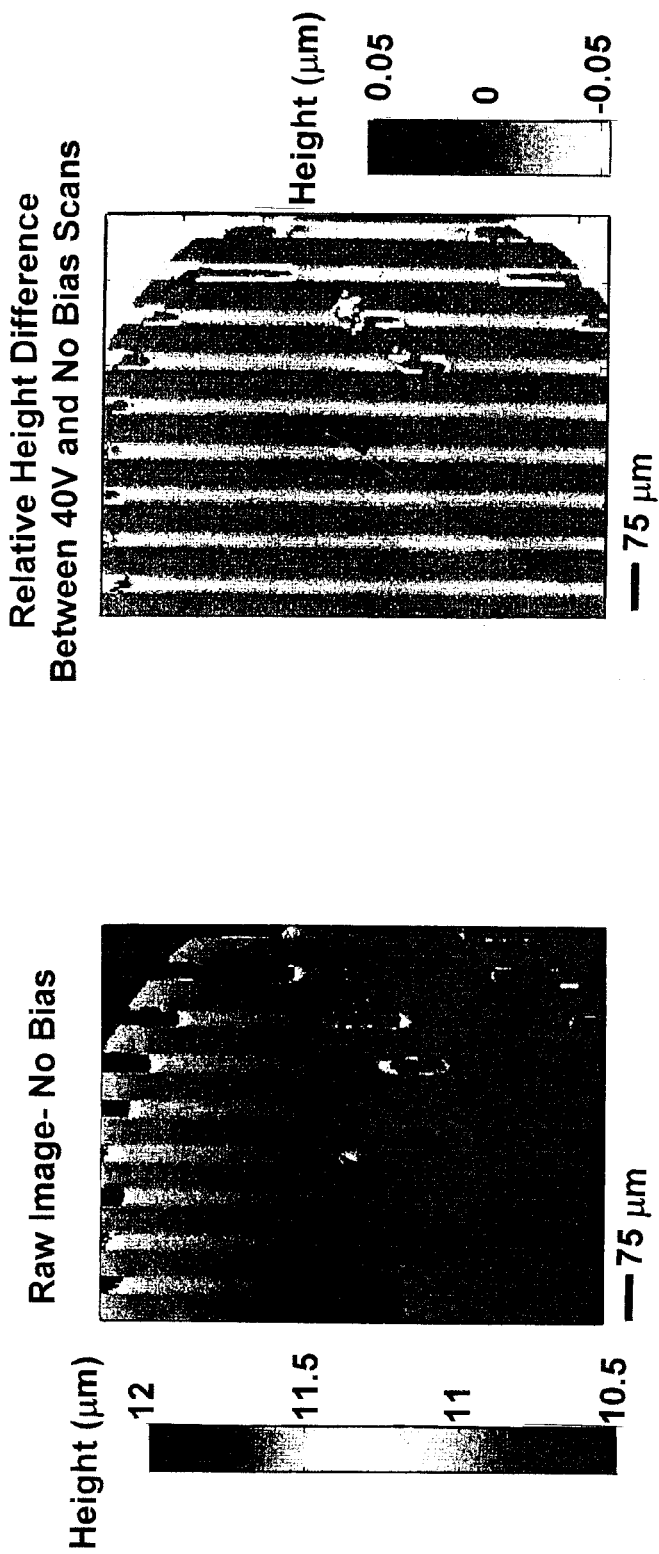
FIGS. 9A and 9B show the profile of a gold diaphragm on a MEMS structure when actuated with a 40 V bias.

The deflection of MEMS diaphragm can be directly observed when the device is actuated during optical profilometry. FIGS. 9A and 9B show the profile of a gold diaphragm on a MEMS structure when actuated with a 40 V bias. In FIG. 9A, the probe tip is not biased and the diaphragm height remains unchanged at about 11.7 μm. In FIG. 9B, the probe tip is biased to 40V and the height of the diaphragm drops to about 0.03 μm relative to the initial height.

Figure 10:
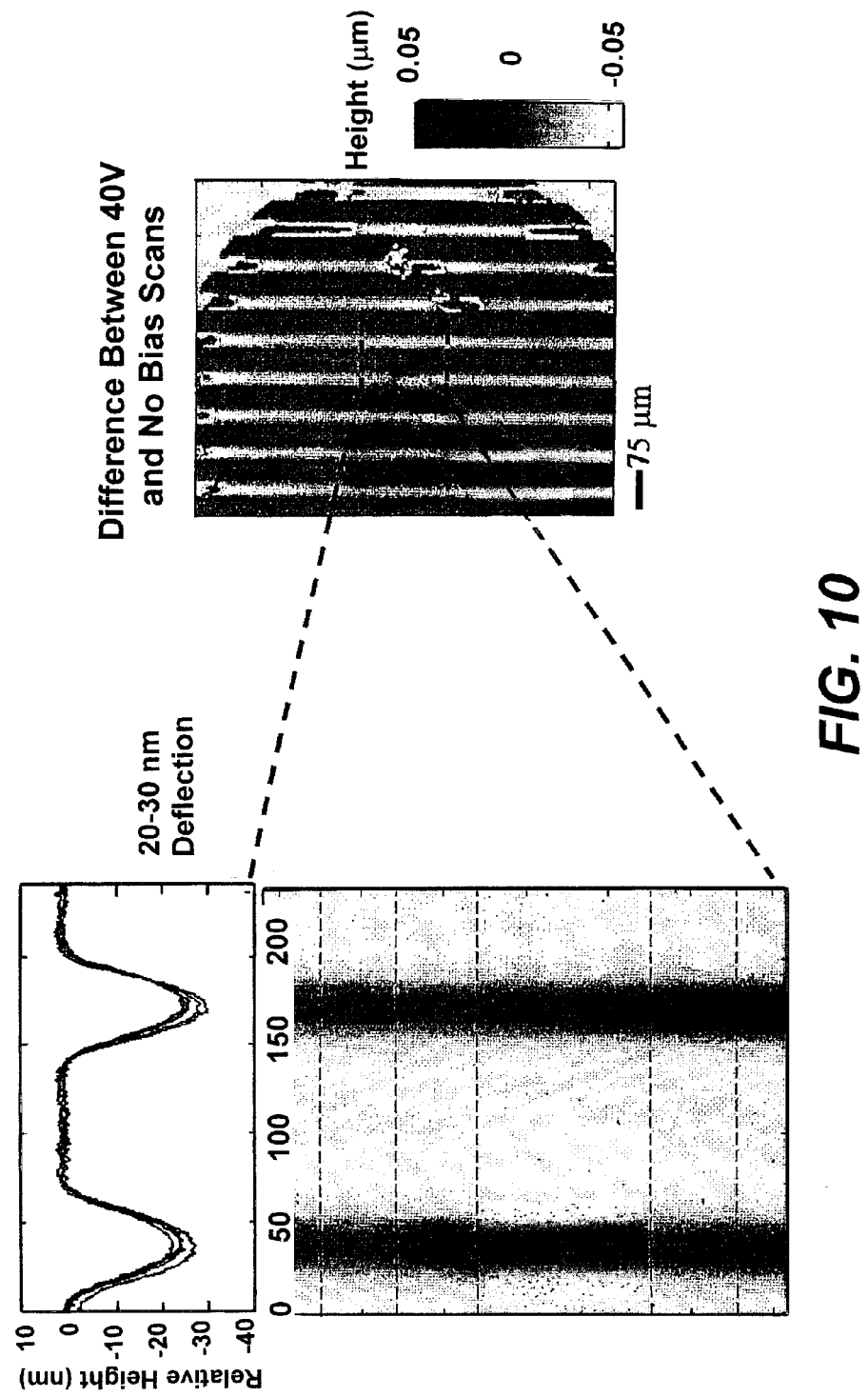
FIG. 10 shows another deflection measurement using optical profilometry.

FIG. 10 shows another deflection measurement using optical profilometry. The device deflection of a membrane can be directly observed when the device is actuated during optical profilometry. In FIG. 10, a deflection of 20-30 nm was observed when the gold diaphragm was biased by 40 V. The change in the relative height of the diaphragm at regions not supported by the PDMS ridges dropped by 20-30 nm.

Increasing the size of the gap can affect deflection. FIG. 11A schematically shows a device prepared according to the disclosed embodiments for deflection testing. The device of FIG. 11A comprised of a gold diaphragm of about 1 mm in diameter. The gold layer had a thickness of about 140 nm. The PDMS ridges were about 20 μm wide and 2.2 μm high. A PDMS under-layer 1100 of about 12 μm was also added to the MEMS configuration of FIG. 11A.

Figure 11B:
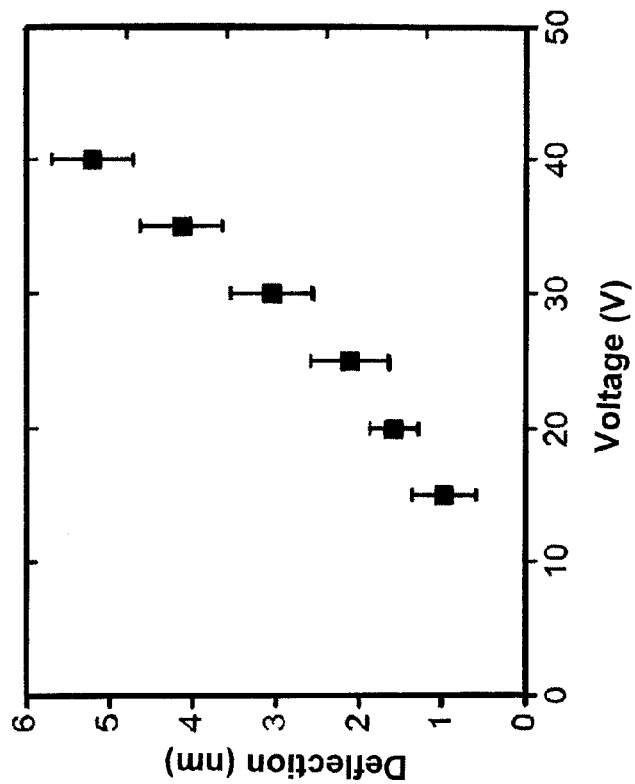
FIG. 11 shows actuation with nanometer precision.
Figure 11A:
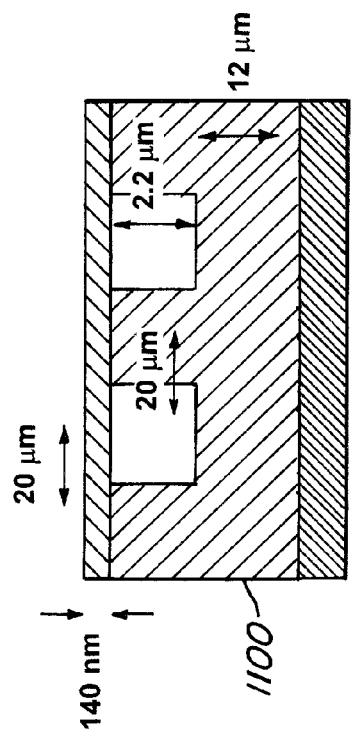

FIG. 11 B shows the deflection in MEMS device of FIG. 11A with increased voltage. FIGS. 11A and B show that the capacitance, deflection, or voltage requirements can be fine-tuned to satisfy the needs of a specific application. It can be seen that as the voltage increases, so does the deflection of the gold diaphragm. Adding the underlayer increases total height of the device and decreases deflection. The device of FIG. 11A had nanometer-scale deflections which was finer than a device with a thinner gap which used the same voltage.

Figure 12A:
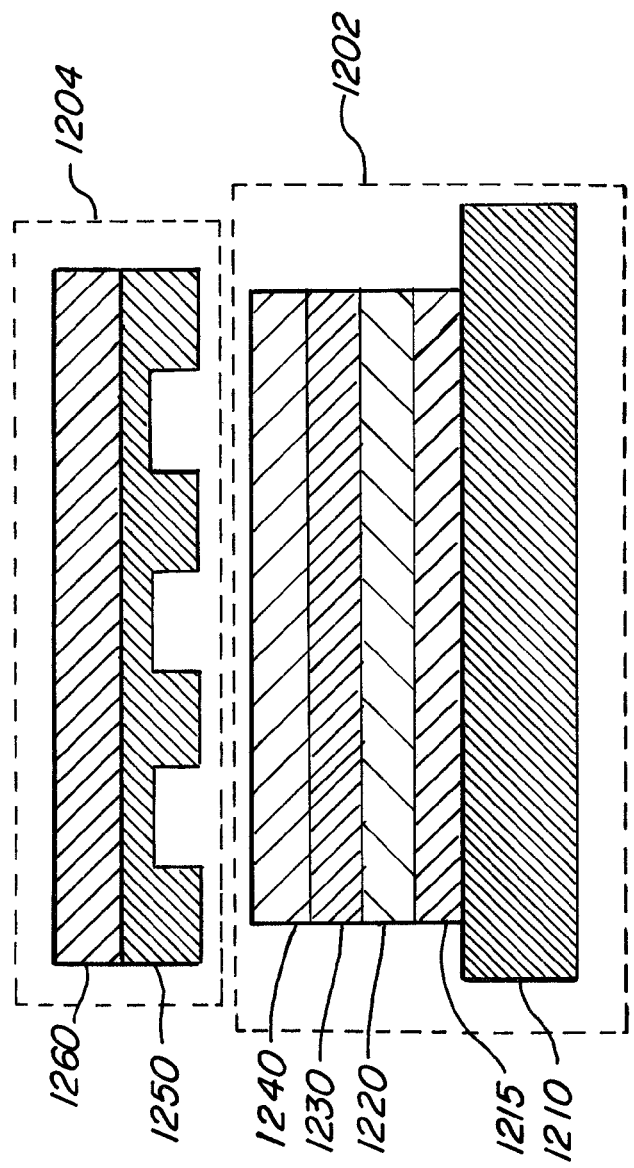
FIG. 12 schematically shows formation of a multilayer MEMS structure according to another embodiment of the disclosure.
Figure 12B:
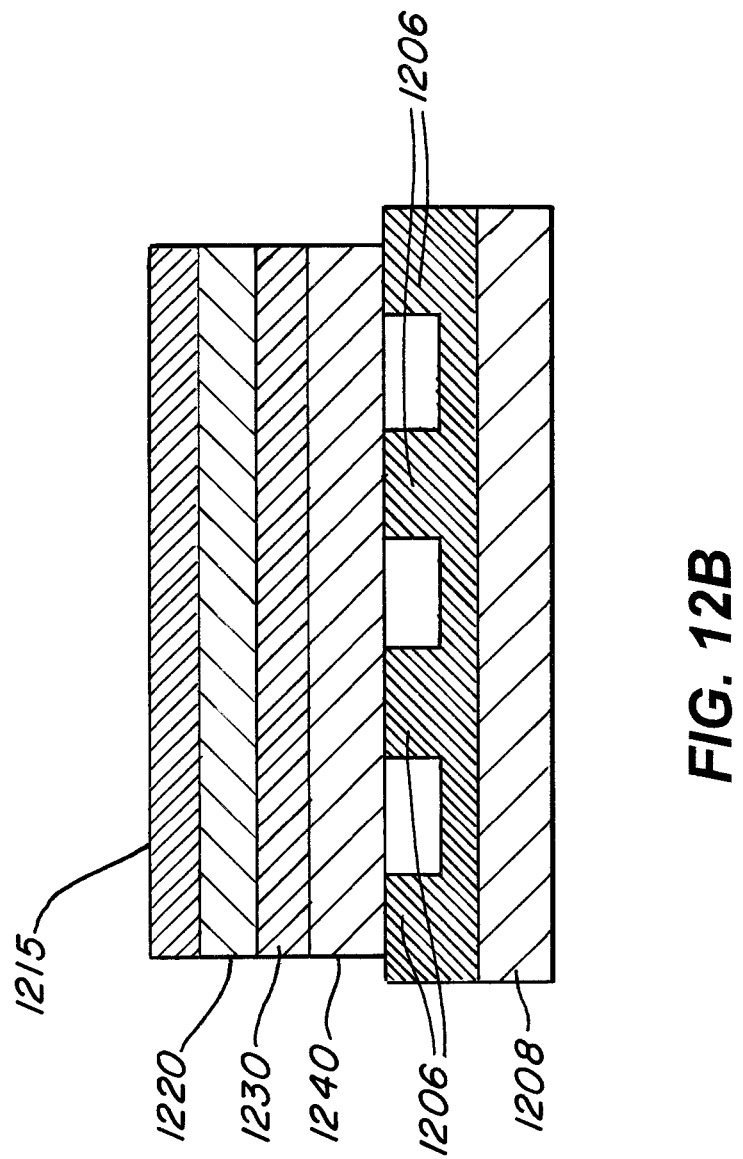
Figure 12C:
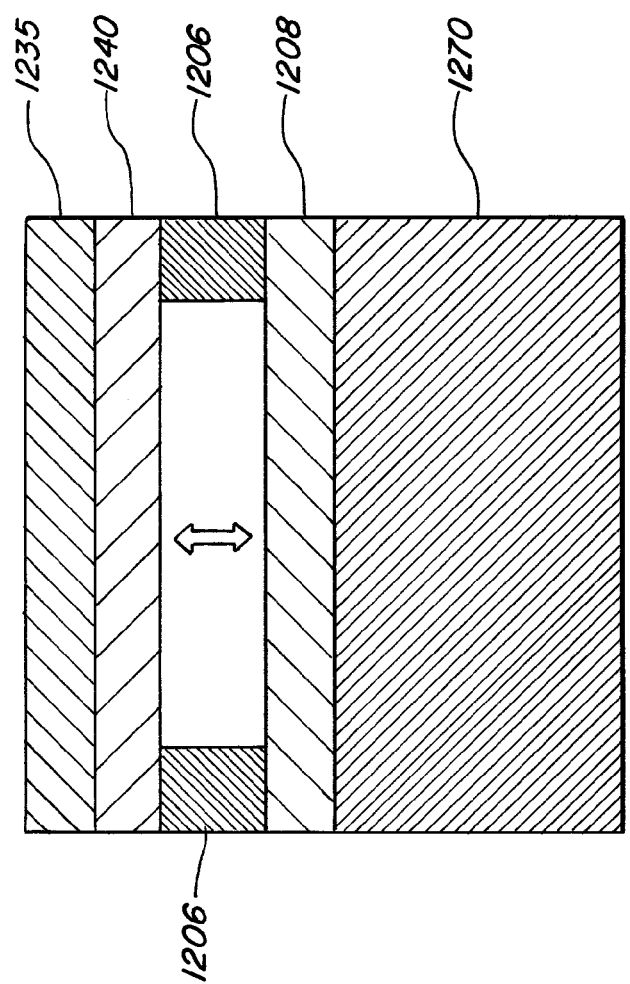

FIGS. 12A-12C schematically show formation of a multi-layer MEMS structure according to another embodiment of the disclosure. In FIG. 12A, a multilayer structure is formed over a PDMS substrate. Specifically, FIG. 12A shows PDMS substrate 1210 supporting TPD layer 1215, gold layer 1220, silver layer 1230 and organic dye layer 1240. Layer 1240 can contain $Alq_3$, aluminum tris-8-hydroxyquinoline. In FIG. 12A, structure 1202 defines the transfer pad and structure 1204 defines the MEMS stamp structure. MEMS stamp structure 1204 includes ridges 1250 and ITO 1260. ITO 1260 defines an electrode for the MEMS structure 1204.

MEMS structure 1204 is brought into conforming contact with the transfer pad 1204. MEMS stamp structure 1204 is delaminated from the transfer pad and shown in FIG. 1213. In one embodiment, structures 1215, 1220, 1230,1240 delaminate as a stack from the transfer pad 1210 and stick to the MEMS structure 1204. MEMS structure 1204 can define an electrode. As illustrated, ridges 1206 support organic dye layer 1240. Metal layers 1220 and 1230 are interposed between organic dye layer 1240 and TPD release layer 1215.

Figure 13:
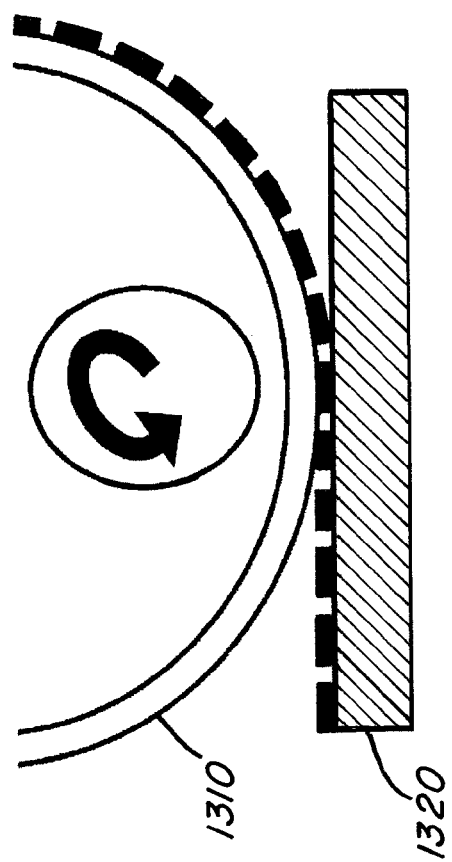
FIG. 13 shows a MEMS structure formed on a flexible substrate according to one embodiment of the invention.

FIG. 13 schematically shows conformal transfer of a MEMS structure according to one embodiment of the disclosure. Specifically, FIG. 13 shows a conformal transfer of a MEMS structure from a flat substrate to a curved substrate. In FIG. 13, curved surface 1310 rotates clockwise as shown by the arrow.

The principles disclosed above regarding transferring from one flat surface to another can be employed for transferring from a curve surface to a flat surface. Namely, a release layer can be used at substrate 1320 to enable easy deposition of the MEMS device on curved surface 1310. Moreover, using the disclosed principles roll-to-roll transfer can be made from a curved substrate to another flat or curved substrate.

Figure 14:
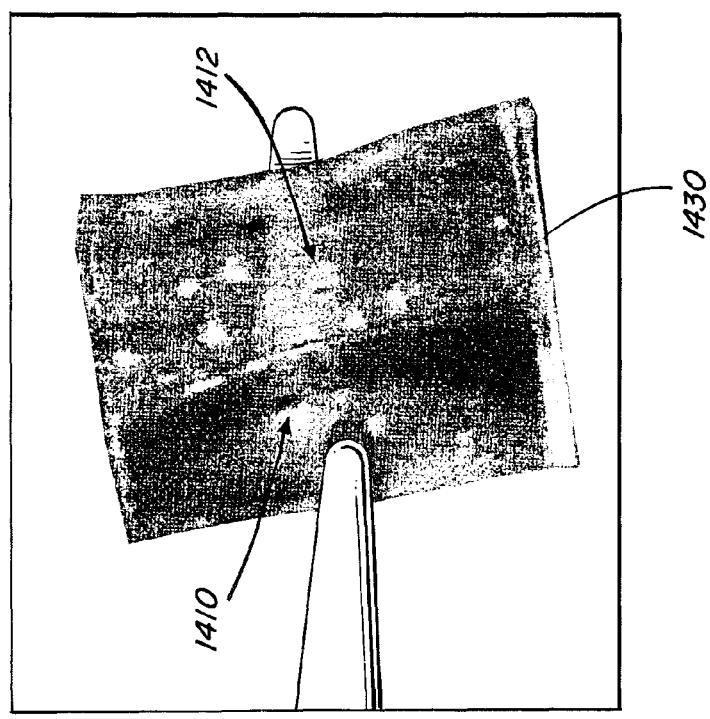
FIG. 14 shows an embodiment of the disclosure formed on a flexible plastic substrate.

FIG. 14 shows an embodiment of the disclosure formed on a flexible plastic substrate. Namely, the lift-off transfer process described above was used to form MEMS structures 1410 and 1420, among others, on the flexible and transparent ITO electrode 1430.

An additional embodiment of the disclosure relates to providing a MEMS structure made from an entirely transparent material making the device structure and substrate invisible to the naked eye. For instance, the components of a device could be made of the following: indium tin oxide-bottom electrode, PET or glass-substrate, PDMS-support structures, graphene-top electrode/membrane material. Graphene is an electrically conductive material made up of a single or several sheets of graphite. At suitable thicknesses, graphene is transparent in the visible range of the spectrum. By creating fully transparent MEMS, several potential applications can be made, including microphone arrays on windows and displays (e.g., computer, television, etc.) for discrete sound recording and sound source location and pressure sensor arrays on automobiles and cars, which provide fluid flow information without changing the aesthetics of the vehicle body. In an exemplary application of graphene, a MEMS structure may be made by forming a PDMS structure interposed between an ITO electrode and a sheet of graphene. The graphene membrane may be supported by a plurality of the PDMS ridges similar to those described above. The MEMS device provides transparency to the naked eye while providing functional capabilities described herein.

While the principles of the disclosure have been illustrated in relation to the exemplary embodiments shown herein, the principles of the disclosure are not limited thereto and include any modification, variation or permutation thereof.

What is claimed is:

1. A method for micro-contact printing of a MEMS structure, the method comprising:
    providing a MEMS structure having a plurality of ridges;
    providing a support structure having a substrate for supporting a release layer and a conducting layer;
    bringing the MEMS structure into conformal contact with the support structure; and
    rapidly peeling the MEMS structure from the support structure so as to delaminate substantially all of the conducting layer metal layer from the support structure;
    wherein the peeling velocity is in the range is about 3 m/sec or more and wherein the metal layer forms a suspended membrane at a gap between a pair of the plurality of ridges.

2. The method of claim 1, wherein the peeling velocity is about 5 m/sec.

3. The method of claim 1, wherein the step of providing the MEMS structure further comprises: forming a layer of indium tin oxide oxide (ITO) over a substrate; depositing an elastomeric layer over the ITO layer; and forming the plurality of ridges in the elastomeric layer.

4. The method of claim 3, wherein the elastomeric layer is poly(dimethylsiloxane) (PDMS).

5. The method of claim 1, wherein the step of providing the MEMS structure further comprises: (i) spin casting PDMS and curing agent at a weight ratio of about 10:1 in a mold; (ii) forming an ITO-coating glass substrate; (iii) adjoining the cured PDMS to the substrate so as to interpose the ITO coating between the glass and the cured PDMS; and (iv) removing the mold from the cured PDMS.

6. The method of claim 5, wherein the PDMS includes a plurality of ridges in which adjacent ridges are separated by a gap of about 10-50 nm.

7. The method of claim 5, wherein the PDMS includes a plurality of ridges in which adjacent ridges are separated by a gap of about 1-50 µm.

8. The method of claim 1, wherein the step of providing a support structure further comprises depositing a van der Waal bonded organic film.

9. The method of claim 8, wherein the van der Waals bonded organic film defines a molecular thin film.

10. The method of claim 8, wherein the step of providing a support structure further comprises depositing a TPD layer over a molded substrate to achieve a discontinuous film with a plurality of raised portions for defining the desired pattern and evaporating the metal layer over the TPD layer to form a discontinuous metal film.

11. The method of claim 8, wherein the van-der-Waals bonded organic film is N,N'-diphenyl-N-N'-bis(3-methylphenyl)-(1,1'-biphenyl)-4,4'-diamine (TPD).

12. The method of claim 8, wherein the step of providing a support structure further comprises: depositing a layer of TPD over the substrate; evaporating the metal layer over the TPD layer by shadow masking.

13. The method of claim 1, wherein the metal layer is selected from the group consisting of gold, silver, and other thermally evaporated metals.

14. The method of claim 1, wherein the MEMS structure defines a capacitor array.

15. The method of claim 1, wherein the conducting layer is selected from the group consisting of a metal, a conducting metal oxide or a doped polymer.

* * * * *